(12) United States Patent
Koo et al.

(10) Patent No.: US 10,782,752 B2
(45) Date of Patent: Sep. 22, 2020

(54) WIRELESS CHARGER FOR MOBILE TERMINAL WITHIN VEHICLE, AND VEHICLE

(71) Applicant: LG ELECTRONICS INC., Seoul (KR)

(72) Inventors: Dohyun Koo, Seoul (KR); Joongnyon Kim, Seoul (KR); Seongjae Jang, Seoul (KR); Inkeun Ryu, Seoul (KR); Joosik Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 167 days.

(21) Appl. No.: 15/887,681

(22) Filed: Feb. 2, 2018

(65) Prior Publication Data

US 2018/0224909 A1   Aug. 9, 2018

(30) Foreign Application Priority Data

Feb. 3, 2017   (KR) .......................... 10-2017-0015572

(51) Int. Cl.
| | |
|---|---|
| *G06F 1/20* | (2006.01) |
| *G06F 1/16* | (2006.01) |
| *H02J 7/00* | (2006.01) |
| *H05K 7/20* | (2006.01) |
| *H05K 5/02* | (2006.01) |
| *H02J 50/10* | (2016.01) |
| *H02J 50/12* | (2016.01) |

(52) U.S. Cl.
CPC ............ *G06F 1/203* (2013.01); *G06F 1/1632* (2013.01); *H02J 7/0044* (2013.01); *H02J 50/10* (2016.02); *H02J 50/12* (2016.02); *H05K 5/0213* (2013.01); *H05K 7/20145* (2013.01)

(58) Field of Classification Search
CPC ............ G06F 1/181–182; G06F 1/203; G06F 1/1632; H05K 7/20218–20381; H05K 7/20409–20418; H05K 5/0213; H01L 23/367–3677; H01L 23/473; H01L 23/46–467; H02J 50/10; H02J 7/0044; H02J 7/025; H02J 50/12
See application file for complete search history.

(56) References Cited

U.S. PATENT DOCUMENTS

| | | | |
|---|---|---|---|
| 9,445,524 B2 * | 9/2016 | Lofy | .................. H05K 7/20209 |
| 9,451,723 B2 * | 9/2016 | Lofy | .................. H05K 7/20136 |

(Continued)

FOREIGN PATENT DOCUMENTS

| | | |
|---|---|---|
| CN | 205670722 U | 11/2016 |
| KR | 10-2014-0065090 A | 5/2014 |

(Continued)

*Primary Examiner* — Robert J Hoffberg
(74) *Attorney, Agent, or Firm* — Birch, Stewart, Kolasch & Birch, LLP

(57) ABSTRACT

Disclosed is a wireless charger for a mobile terminal in a vehicle, the wireless charger including: a tray on which the mobile terminal is placed and which has one or more holes; a coil part configured to wirelessly provide electrical energy to the mobile terminal; a driving part configured to drive the coil part; a case which accommodates the coil part and the driving part and in which an air flow path is formed; and a fan module configured to discharge air toward the mobile terminal through the holes or suction ambient air of the mobile terminal.

18 Claims, 14 Drawing Sheets

(56) References Cited

U.S. PATENT DOCUMENTS

| | | | |
|---|---|---|---|
| 9,701,172 B2 * | 7/2017 | Tsuzaki | B60H 1/00457 |
| 9,861,006 B2 * | 1/2018 | Lofy | H05K 7/20145 |
| 10,219,407 B2 * | 2/2019 | Lofy | H05K 7/20209 |
| 10,259,400 B1 * | 4/2019 | Song | B60R 11/0241 |
| 10,270,276 B2 * | 4/2019 | Kim | H02J 7/025 |
| 10,439,423 B2 * | 10/2019 | Lachnitt | H02J 50/10 |
| 10,455,728 B2 * | 10/2019 | Lofy | H02J 7/025 |
| 2006/0232929 A1 * | 10/2006 | Huang | G06F 1/1632 361/688 |
| 2010/0080399 A1 * | 4/2010 | Pfau | B60N 2/56 381/71.4 |
| 2011/0254503 A1 * | 10/2011 | Widmer | B60L 3/0069 320/108 |
| 2016/0072327 A1 * | 3/2016 | Knutson | G06F 1/1632 320/108 |
| 2016/0276866 A1 * | 9/2016 | Lachnitt | H02J 50/10 |
| 2016/0336789 A1 * | 11/2016 | Hyun | H02J 7/025 |
| 2017/0164513 A1 * | 6/2017 | Lofy | H05K 7/20209 |
| 2018/0198313 A1 * | 7/2018 | Lee | H02J 7/025 |
| 2019/0014683 A1 * | 1/2019 | Han | H05K 7/20145 |
| 2019/0115781 A1 * | 4/2019 | Feng | H02J 50/12 |
| 2019/0215984 A1 * | 7/2019 | Pinkos | H02J 50/10 |
| 2019/0229550 A1 * | 7/2019 | Kim | H02J 7/025 |
| 2020/0021125 A1 * | 1/2020 | Thiel | H02J 50/12 |
| 2020/0091755 A1 * | 3/2020 | Larsson | H02J 7/025 |

FOREIGN PATENT DOCUMENTS

| | | | | |
|---|---|---|---|---|
| KR | 10-2015-0037904 A | 4/2015 | | |
| KR | 10-2015-0107671 A | 9/2015 | | |
| KR | 10-2016-0118911 A | 10/2016 | | |
| WO | WO-2019085839 A1 * | 5/2019 | | H02J 7/00 |

* cited by examiner

100

100

WIRELESS CHARGER FOR MOBILE TERMINAL WITHIN VEHICLE, AND VEHICLE

CROSS-REFERENCE TO RELATED APPLICATION

This application claims the priority benefit of Korean Patent Application No. 10-2017-0015572, filed on Feb. 3, 2017 in the Korean Intellectual Property Office, the disclosure of which is incorporated herein by reference.

BACKGROUND OF THE INVENTION

1. Field of the Invention

The present invention relates to a wireless charger for a mobile terminal in a vehicle.

2. Description of the Related Art

Various wireless chargers for mobile terminals are available in the market. A wireless charger generally outputs electrical energy of 5 W to a mobile terminal. In this case, 80% up to 90% of the supplied electrical energy is converted into heat. This amount of heat does not affect operation and charging of the mobile terminal, and thus, an additional heat processing apparatus is not required.

Meanwhile, mobile terminals provide various functions for communication with a vehicle.

When used in a vehicle, a mobile terminal needs to keep charged while performing the various functions. For this reason, it is necessary to charge the mobile terminal with power greater than 5 W. In this case, heat great enough to affect the functions or charging of the mobile terminal will be generated during the charging. Therefore, for a wireless charger for a mobile terminal in a vehicle, there is need for a technology for managing heat generated during wireless charging.

SUMMARY OF THE INVENTION

The present invention has been made in view of the above problems, and it is one object of the present invention to provide a wireless charger for a mobile terminal in a vehicle, the wireless charger which is able to manage heat generated during wireless charging.

It is another object of the present invention to provide a vehicle including a wireless charger for a mobile terminal within the vehicle.

Objects of the present invention should not be limited to the aforementioned objects and other unmentioned objects will be clearly understood by those skilled in the art from the following description.

In accordance with an embodiment of the present invention, the above and other objects can be accomplished by the provision of a wireless charger for a mobile terminal in a vehicle, the wireless charger including: a tray on which the mobile terminal is placed and which has one or more holes; a coil part configured to wirelessly provide electrical energy to the mobile terminal; a driving part configured to drive the coil part; a case which accommodates the coil part and the driving part and in which an air flow path is formed; and a fan module configured to discharge air toward the mobile terminal through the holes or suction ambient air of the mobile terminal.

The wireless charger may further include a coupling antenna configured to receive a mobile communication signal through an antenna provided in the vehicle, and transfer the mobile communication signal to the mobile terminal.

The tray may include: a base having a plurality of holes formed therein; and a contact part protruding from the base to contact with the mobile terminal.

The base may have a first size, the plurality of holes may be formed in a first region of the base, the first region may have a second size smaller than a size of the mobile terminal, and the first region may be located at a center of the base.

The contact part may include a friction member.

The air flow path may include: a first air passage formed in a first direction and having one end connected to a fan module accommodator which accommodates the fan module; a second air passage formed in a second direction and having one end extending from the other end of the first air passage; and a third air passage formed in a third direction, and having one end extending from the other end of the second air passage and the other end connected through the holes to a space where the mobile terminal is placed.

The wireless charger may further include a foreign substance blocking part formed in a portion in which the first air passage and the second air passage are connected.

The wireless charger may further include a partition wall disposed in the first air passage and formed at a predetermined angle relative to the first air passage; and a foreign substance discharge hole formed in the first air passage to discharge a foreign substance, blocked by the partition wall, to an outside of the wireless charger.

The second air passage may be formed such that a cross section gradually become narrower in a direction from one end to the other end.

The tray may be disposed at a predetermined angle relative to a ground surface.

The fan module may be disposed above the tray.

The fan module may include a first fan and a second fan, and the air flow path may include: a first air flow path connected to a first fan accommodator, which accommodates the first fan, to discharge air toward the mobile terminal through the holes; and a second air flow path connected to a second fan accommodator, which accommodates the second fan, to discharge air toward the coil part and the driving part.

The air flow path may include a first air passage disposed between the tray and the coil part, and a second air passage disposed between the coil part and the driving part. The fan module may induce air to flow through the first air passage and the second air passage.

The tray may include a plate-shaped base and a contact part protruding from the base to contact with the mobile terminal, and the holes may be formed on lateral surfaces of the contact part.

The driving part may include: a circuit board; an interface unit mounted on the circuit board and configured to receive driving situation information; and a processor mounted on the circuit board. The processor may be configured to control driving of the fan module based on the driving situation information.

The interface unit may be configured to receive vehicle speed information, and the processor may control a rotational speed of the fan module based on the vehicle speed information.

The processor may be configured to receive temperature information from the mobile terminal, and control a rotational speed of the fan module based on the temperature information.

The processor may be configured to receive the temperature information through the coil part.

The processor may be configured to, after wireless charging of the mobile terminal is complete, control the fan module to be driven for a preset period of time.

In another general aspect, there is provided a vehicle including the wireless charger.

The details of other embodiments are included in the following description and the accompanying drawings.

The embodiments of the present invention have one or more effects as follows.

First, it is possible to prevent a wireless charger from being affected by heat generated by wireless charging of a mobile terminal, when the mobile terminal is being charged in a vehicle while operating in conjunction with the vehicle.

Second, it is possible to enable the wireless charger to operate normally even when a foreign substance such as water comes into the wireless charger through holes.

Third, it is possible to prevent noise from driving of a fan from disturbing a user, by appropriately controlling a rotational speed of a fan module based on driving situation information.

Effects of the present invention should not be limited to the aforementioned effects and other unmentioned effects will be clearly understood by those skilled in the art from the claims.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

Figure 1:
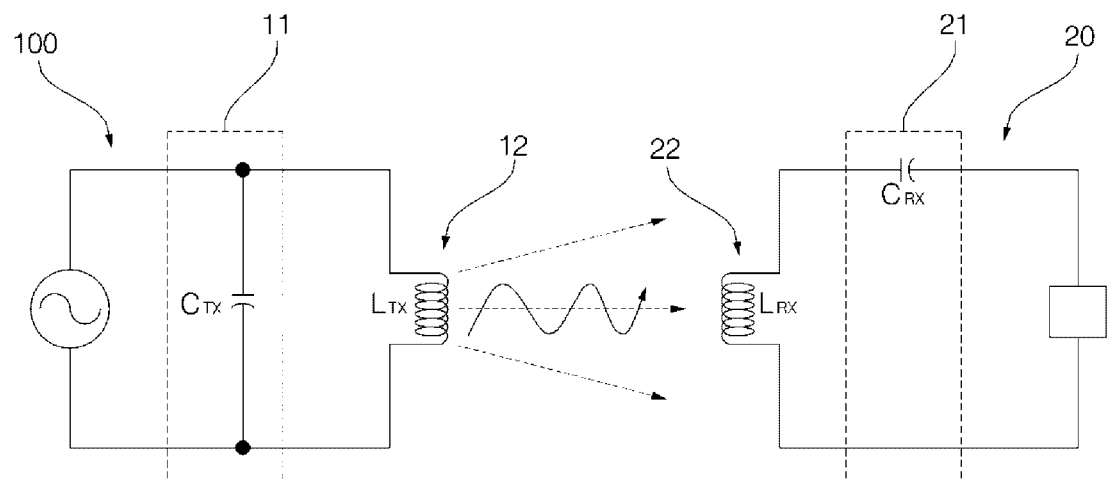
FIG. 1 is a diagram illustrating a wireless charging method of a wireless charger for a mobile terminal in a vehicle according to an embodiment of a present invention.

Hereinafter, the embodiments disclosed in the present specification will be described in detail with reference to the accompanying drawings, and the same or similar elements are denoted by the same reference numerals even though they are depicted in different drawings and redundant descriptions thereof will be omitted. In the following description, with respect to constituent elements used in the following description, the suffixes "module" and "unit" are used or combined with each other only in consideration of ease in the preparation of the specification, and do not have or serve as different meanings. Accordingly, the suffixes "module" and "unit" may be interchanged with each other. In addition, in the following description of the embodiments disclosed in the present specification, a detailed description of known functions and configurations incorporated herein will be omitted when it may make the subject matter of the embodiments disclosed in the present specification rather unclear. In addition, the accompanying drawings are provided only for a better understanding of the embodiments disclosed in the present specification and are not intended to limit the technical ideas disclosed in the present specification. Therefore, it should be understood that the accompanying drawings include all modifications, equivalents and substitutions included in the scope and sprit of the present invention.

It will be understood that although the terms "first," "second," etc., may be used herein to describe various components, these components should not be limited by these terms. These terms are only used to distinguish one component from another component.

It will be understood that when a component is referred to as being "connected to" or "coupled to" another component, it may be directly connected to or coupled to another component or intervening components may be present. In contrast, when a component is referred to as being "directly connected to" or "directly coupled to" another component, there are no intervening components present.

As used herein, the singular form is intended to include the plural forms as well, unless the context clearly indicates otherwise.

In the present application, it will be further understood that the terms "comprises", includes," etc. specify the presence of stated features, integers, steps, operations, elements, components, or combinations thereof, but do not preclude the presence or addition of one or more other features, integers, steps, operations, elements, components, or combinations thereof.

A vehicle as described in this specification may include an automobile and a motorcycle. Hereinafter, a description will be given based on an automobile.

A vehicle as described in this specification may include all of an internal combustion engine vehicle including an engine as a power source, a hybrid vehicle including both an engine and an electric motor as a power source, and an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

FIG. 1 is a diagram illustrating a wireless charging method of a wireless charger for a mobile terminal in a vehicle according to an embodiment of the present invention.

Referring to FIG. 1, a wireless charger 100 for a mobile terminal in a vehicle may use inductive coupling or resonance coupling.

Inductive coupling works on the principle that, when intensity of a current flowing in a primary coil between two adjacent coils is changed, a magnetic field is changed by the current and in turn a magnetic flux passing through a secondary coil is changed to thereby generate an induced electromotive force on the side of the secondary coil. That is, if two coils are placed close to each other and only a current of the primary coil is changed, an induced electromotive force may be generated even though two wires are not moved spatially. In this case, frequency characteristics are not influenced greatly. However, power efficiency may be affected depending on alignment and distance between a transmitter (for example, a wireless charger) including the respective coils and a receiver (for example, a mobile terminal).

Resonance coupling works on the principle that, when two coils are at a specific distance, a resonant frequency is applied to a primary coil between the two coils to thereby generate variation of a magnetic field and some of the variation is applied to a secondary coil having the same resonant frequency to thereby generate an induced electromotive force. According to this method, if a transmitter and a receiver resonate at the same frequency, a magnetic wave is transferred through a near magnetic field. Thus, if the transmitter and the receiver have different frequencies, energy is not transferred therebetween. In this case, selecting a frequency may be important. Energy is not transferred between resonant frequencies which are at a specific distance or more, and a device to be charged may be selected by selecting a resonant frequency. If a single device is allocated to each resonant frequency, selecting a resonant frequency may be equivalent to selecting a device to be charged.

Resonance coupling has advantages over inductive coupling in that power efficiency is relatively less affected by alignment of a transmitter, including the respective coils, and a receiver and a distance between the transmitter and the receiver.

Hereinafter, a wireless charger using resonance coupling will be described, but it is understood that the wireless charger according to an embodiment of the present invention is able to use inductive coupling as well.

First of all, resonance will be briefly explained. Resonance is a phenomenon in which a vibrating system periodically receives an external force having a frequency identical to a natural frequency of the vibrating system and therefore amplitude increases prominently. Resonance occurs in all types of vibration including mechanical vibration and electrical vibration. In general, if an external force drives the vibrating system to vibrate and has a frequency identical to a natural frequency of the vibrating system, it may lead to high intensity of vibration with large amplitude.

On the same principle, if a plurality of vibrators at a specific distance from each other vibrates at the same frequency, the plurality of vibrators mutually resonates and resistance of the plurality of vibrators is reduced. In an electrical circuit, a resonant circuit may be formed using inductors and capacitors.

The wireless charger 100 using resonance coupling may include a first coil part. The first coil part includes a first capacitance and a first inductance. A second coil part includes a second capacitance and a second inductance.

Meanwhile, the first inductance L is determined based on a distance between adjacent coils in the first coil part, and length and the number of rotation of the respective coils. In addition, the first capacitance C is determined based on a distance between the coils and the size of the coils.

The second inductance L is determined based on a distance between adjacent coils in the second coil part, and length and the number of rotation of the respective coils. In addition, the second capacitance C is determined based on a distance between the coils and the size of the coils.

An equivalent capacitance is a value calculated based on the first and second capacitances. The equivalent inductance is a value calculated based on the first and second inductances.

A resonant frequency of the wireless charger 100 is determined by an equivalent capacitance and an equivalent inductance as in the following equation.

$$f = \frac{1}{2\pi\sqrt{LC}} \qquad \text{Equation 1}$$

If a resonant frequency is determined as in the above equation, the wireless charger 100 may change the resonant frequency by adjusting the first capacitance, the first inductance, the second capacitance, or the second inductance.

Reference numeral 11 in FIG. 1 indicates an equivalent capacitance of the wireless charger 100. Reference numeral 12 in FIG. 1 indicates an equivalent inductance of the wireless charger 100.

A magnetic field having a specific vibration frequency is formed by a voltage applied to the wireless charger 100. If a resonance phenomenon occurs in a mobile terminal 20 due to the magnetic field, power is generated in the mobile terminal 20 due to the resonance phenomenon.

If a plurality of vibrators electromagnetically and mutually resonates as described above, they may not be influenced by objects other than themselves and therefore efficiency of power transmission may increase. An energy tunnel may occur among the vibrators. Such an energy tunnel is called an energy coupling or an energy tail.

Resonance coupling disclosed in this specification may use an electromagnetic wave having a low frequency. If power is transferred using the electromagnetic wave having a low frequency, only a magnetic field may affect a region located at a single wavelength of the electromagnetic wave. This may be called a magnetic coupling or a magnetic resonance. The magnetic resonance may occur when the wireless charger 100 and the mobile terminal 20 are located within the single wavelength of the electromagnetic wave having the low frequency.

Meanwhile, the mobile terminal 20 may include a receiving coil 22 and a resonant circuit 21 which are provided to cause a resonance phenomenon to occur due to a magnetic field formed in the wireless charger 100. The resonant circuit 21 may be implemented using a capacitive circuit. That is, the resonant circuit 21 may be a capacitor part including at least one capacitor. A resonant frequency of the mobile terminal 20 may be obtained by applying an inductance of the receiving coil 22 and a capacitance of the resonant circuit 21 to Equation 1. Configuration of elements of the resonant circuit 21 may vary as long as the resonant circuit is enabled to cause a resonance phenomenon to occur in the mobile terminal 20 due to the magnetic field. Thus, the resonant circuit 21 is not limited to being connected to the receiving coil 22 in series, as shown in FIG. 1.

In the following description, it is assumed that a resonant frequency of the wireless charger 100 matches a resonant frequency of the mobile terminal 20.

Figure 2:
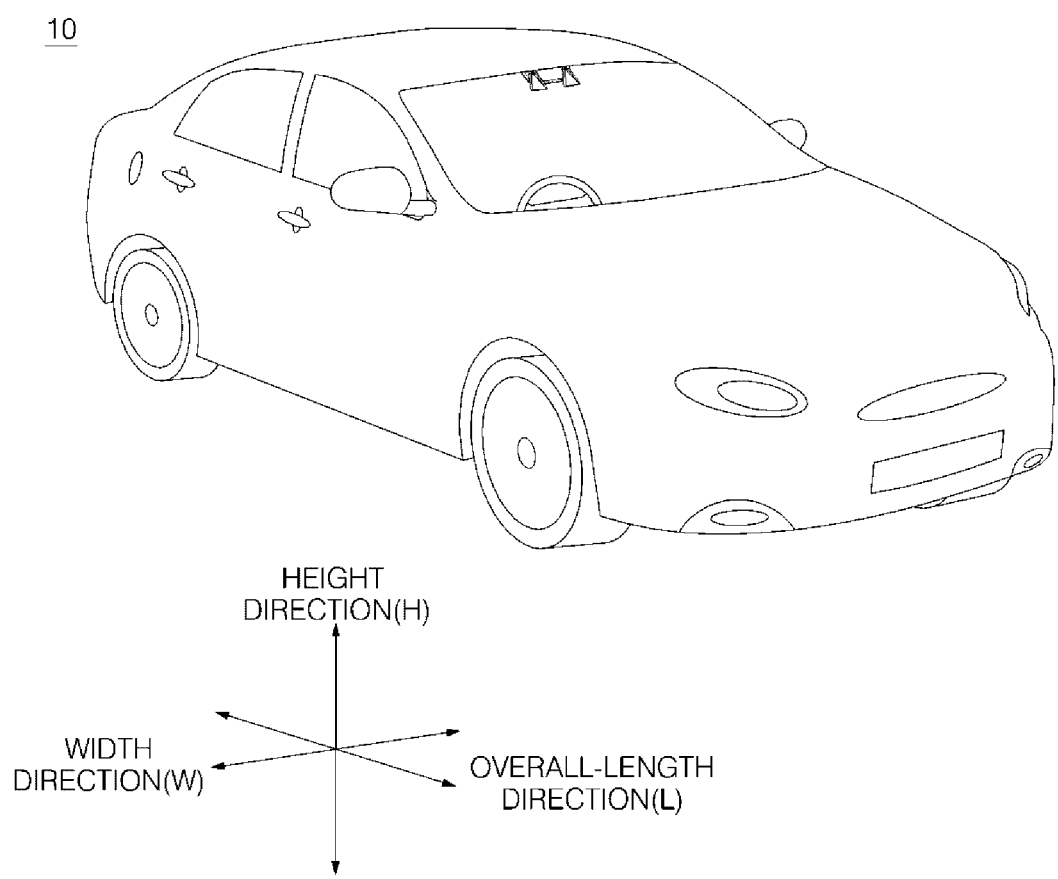
FIG. 2 is a diagram illustrating the exterior appearance of a vehicle according to an embodiment of the present invention.

FIG. 2 is a diagram illustrating an example of the exterior appearance of a vehicle according to an embodiment of the present invention.

A vehicle 10 may include wheels, which are rotated by a power source, and a steering input device for adjusting a direction of travel of the vehicle 10.

The vehicle 10 may be an autonomous vehicle.

The vehicle 10 may switch to an autonomous mode or a manual mode based on a user input.

The vehicle 10 may communicate with the mobile terminal 20. The mobile terminal 20 may perform various functions through communication with the vehicle 10.

The vehicle 10 may include the wireless charger 100.

The mobile terminal 20 may be wirelessly charged while providing various functions through communication with the vehicle 10. In this case, heat may be generated in the wireless charger 100 and the mobile terminal 20.

Heat is generated during charging of the mobile terminal 20. For the purpose of safety, the mobile terminal 20 is designed to stop charging when a sensed temperature is equal to or greater than a preset value.

If wireless charging stops due to heat generated by the wireless charging, it takes long time for full charging and this may cause user inconvenience. In addition, if the mobile terminal 20 is not appropriately charged, it may cause limitation to functions of the mobile terminal 20.

The wireless charger 100 manages heat generated by wireless charging, thereby eliminating the inconvenience caused by the long charging time. In addition, the wireless charger 100 may enable the mobile terminal 20 to perform functions even during wireless charging.

The term "overall length" means the length from the front end to the rear end of the vehicle 10, the term "overall width" means the width of the vehicle 10, and the term "overall height" means the height from the bottom of the wheel to the roof. In the following description, the term "overall length direction L" may mean the reference direction for the measurement of the overall length of the vehicle 10, the term "overall width direction W" may mean the reference direction for the measurement of the overall width of the vehicle 10, and the term "overall height direction H" may mean the reference direction for the measurement of the overall height of the vehicle 10.

Figure 3A:
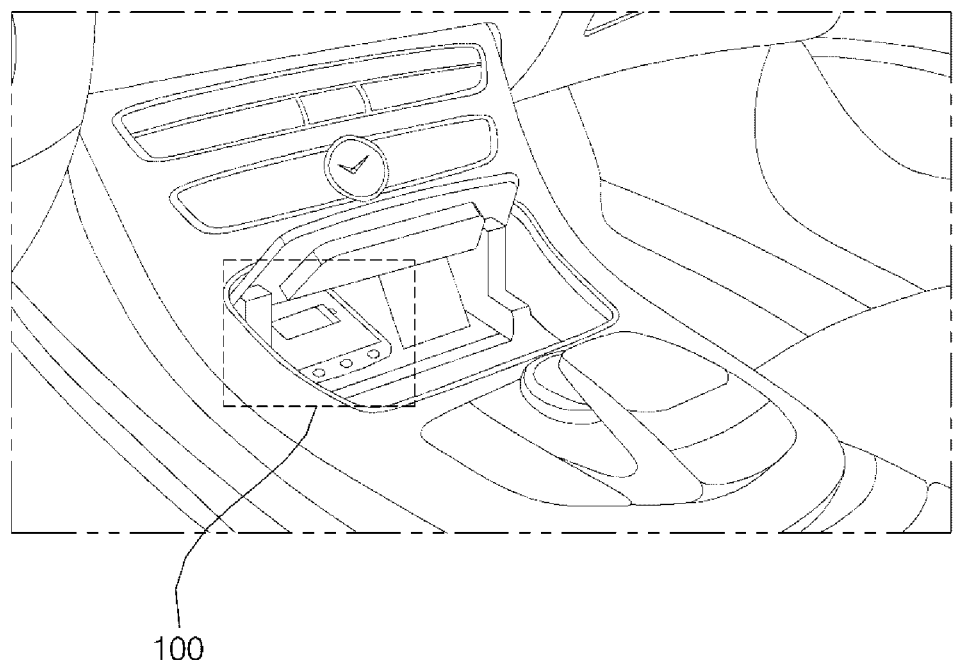
FIGS. 3A and 3B are diagrams illustrating an interior region of a vehicle, the region in which a wireless charger for a mobile terminal in a vehicle according to an embodiment of the present invention is located.
Figure 3B:
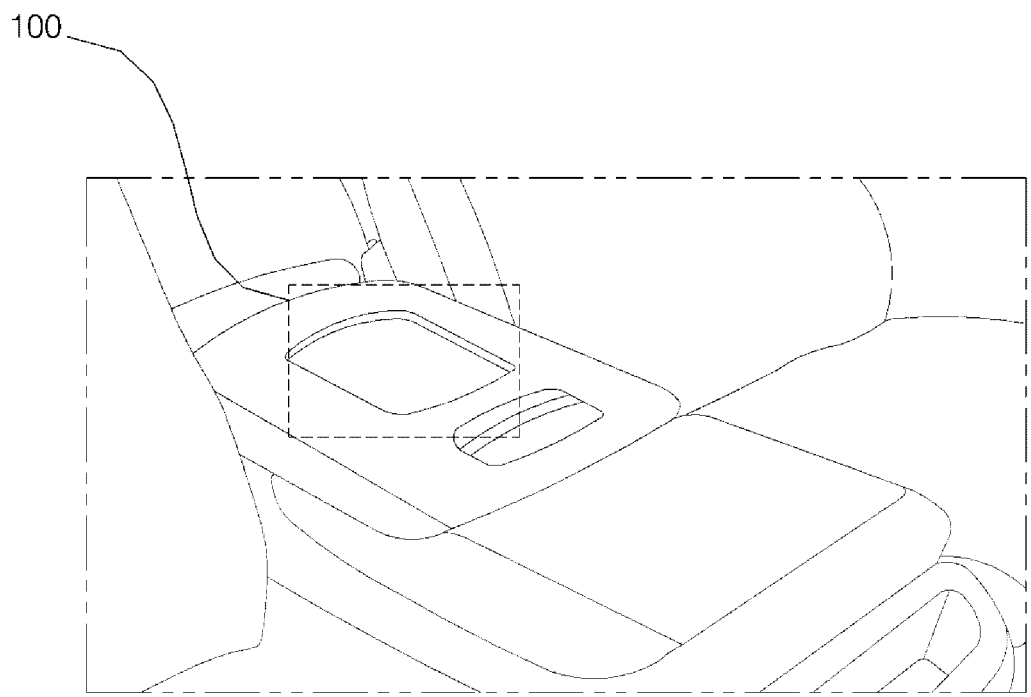

FIGS. 3A and 3B are diagrams illustrating an example of an interior region of a vehicle, the region in which a wireless charger for a mobile terminal in a vehicle according to an embodiment of the present invention is located.

Referring to FIGS. 3A and 3B, the wireless charger 100 may be provided inside the vehicle 10.

For example, the wireless charger 100 may be disposed in one region of the center console, one region of the center fascia, one region of the glove box, or one region of the dash board.

For example, the wireless charger 100 may be disposed in one region of an arm rest of a rear seat.

A pocket may be provided in at least one selected from among the center console, the center fascia, the glove box, the dash board, and the arm rest. The wireless charger 100 may be provided inside the pocket.

The pocket may include a cover. The cover may be open and close automatically or manually.

Based on opening and closing of the cover, the wireless charger 100 may determine whether to perform a wireless charging operation.

For example, a sensing unit 420 (see FIG. 10) may sense opening/closing of the cover and the presence of the mobile terminal 20 in the pocket. If closing of the cover is sensed when the presence of the mobile terminal 20 in the pocket is sensed, the wireless charger 100 may perform wireless charging. If the presence of the mobile terminal 20 in the pocket is not sensed or opening of the cover is sensed, the wireless charger 100 may not perform wireless charging.

Figure 4:
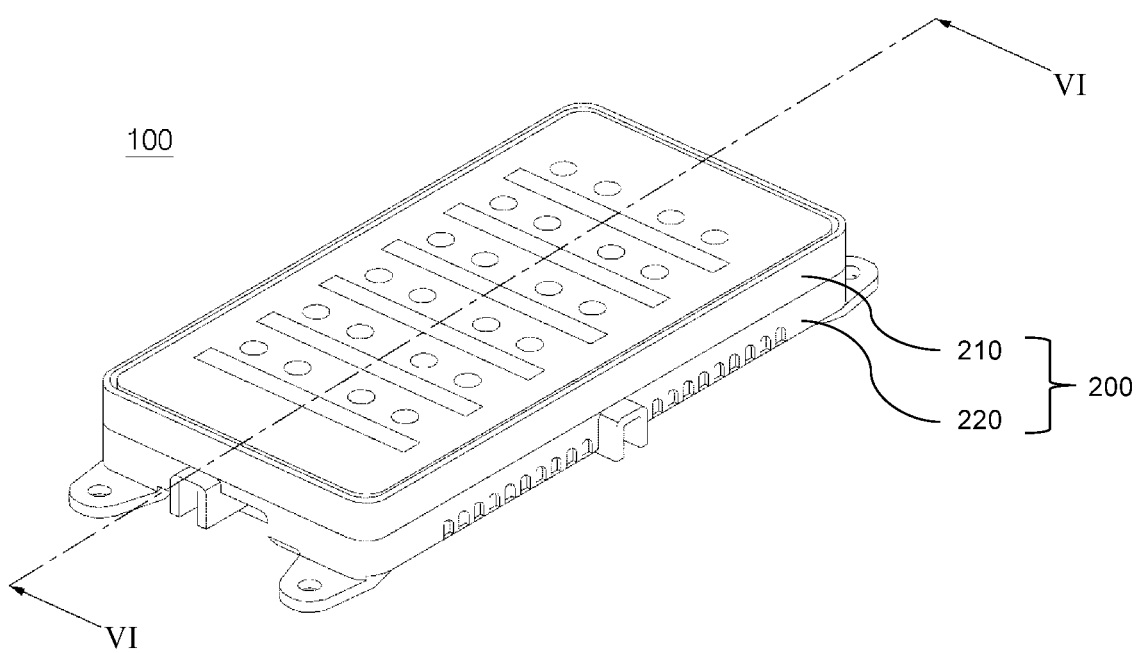
FIG. 4 is a perspective view of a wireless charger for a mobile terminal in a vehicle according to an embodiment of the present invention.

FIG. 4 is a perspective view of a wireless charger for a mobile terminal in a vehicle according to an embodiment of the present invention.

Figure 5:
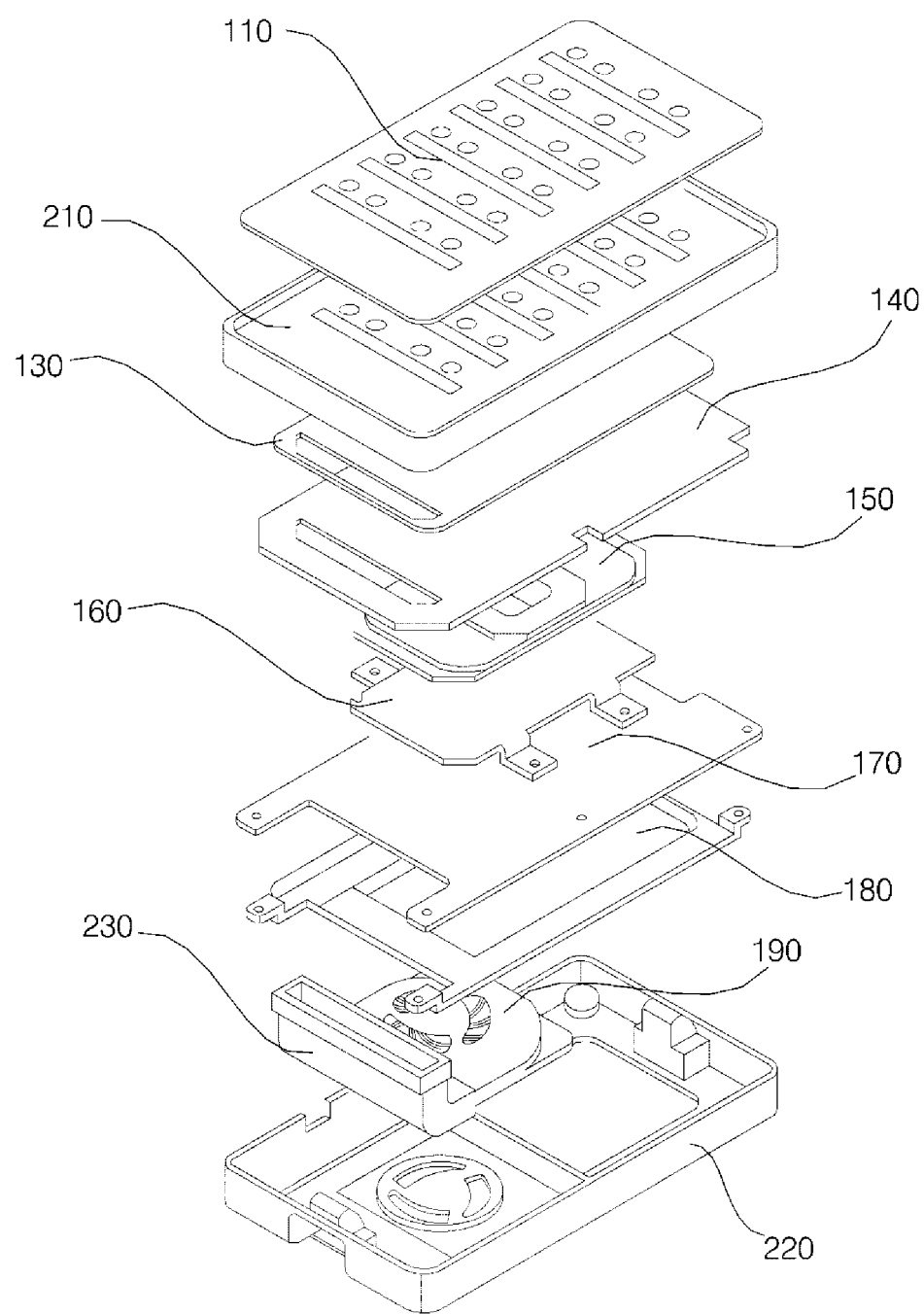
FIG. 5 is an exploded perspective view of a wireless charger for a mobile terminal in a vehicle according to an embodiment of the present invention.

FIG. 5 is an exploded perspective view of a wireless charger for a mobile terminal in a vehicle according to an embodiment of the present invention.

Figure 6:
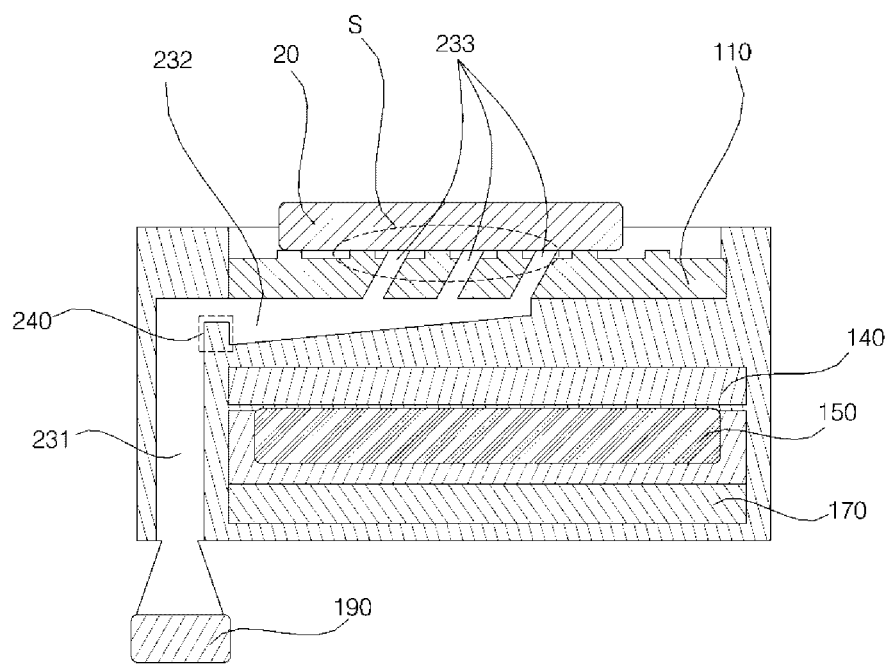
FIG. 6 is a cross-sectional view taken along line VI-VI in FIG. 4.

FIG. 6 is a cross-sectional view taken along line VI-VI in FIG. 4.

Referring to FIGS. 4 to 6, the wireless charger 100 may include a tray 110, a plate 130, a coupling antenna 140, a coil part 150, a coil bracket 160, a driving part 170, a heat sink 180, a fan module 190, and a case 200 (see FIG. 4) including a top case 210 and a bottom case 220.

In some embodiments, the wireless charger 100 may not include some of the aforementioned components, or may further include another component.

The mobile terminal 20 may be placed on the tray 110.

The tray 110 may include one or more holes.

The tray 110 will be described in detail with reference to FIGS. 7 to 8B.

The plate 130 may be positioned between the top case 210 and the coupling antenna 140.

The plate 130 may support the top case 210.

In some embodiments, the plate 130 may be omitted.

The coupling antenna 140 may be disposed below the tray 110.

The coupling antenna 140 may be disposed above the coil part 150.

The coupling antenna 140 may transfer a mobile communication signal to the mobile terminal 20. An antenna provided in the vehicle 10 may receive the mobile communication signal. The coupling antenna 140 may receive the mobile communication signal received through the antenna provided in the vehicle. The coupling antenna 140 may transfer the mobile communication signal to the mobile terminal 20.

The coupling antenna 140 may amplify the received mobile communication signal and transfer the amplified signal to the mobile terminal 20.

If the vehicle 10 travels in an area such as mountain, tunnel, or an underpass in which a reception rate of mobile communication signals is poor, the mobile terminal 20 may not receive a mobile communication signal. In this case, the coupling antenna 140 may receive a mobile communication signal through an antenna having an excellent signal receiving rate, which is provided in the vehicle 10, and transfer the received mobile communication signal to the mobile terminal 20.

Through the coupling antenna, the mobile terminal 20 may receive a mobile communication signal without disruption even in an area with a poor signal receiving rate. As receiving the mobile communication signal without disruption, the mobile terminal 20 may provide a user with various functions (for example, a TPEG navigation function) based on the mobile communication signal.

The coupling antenna 140 may include a near field communication (NFC) antenna.

The NFC antenna may receive information from the mobile terminal 20. For example, the NFC antenna may receive information on temperature of the mobile terminal 20 from the mobile terminal 20. For example, the NFC antenna may receive information on electrical energy required for wireless charging from the mobile terminal 20.

In some embodiments, the coupling antenna 140 may be omitted.

The coil part 150 may be disposed below the tray 110. The coil part 150 may be disposed below the coupling antenna 140.

The coil 150 may be disposed above the driving part 170.

The coil part 150 may operate in accordance with a driving signal provided by the driving part 170. The coil part 150 may be electrically connected to the driving part 170. Specifically, the coil part 150 may be electrically connected to a processor 470 (see FIG. 10), included in the driving part 170, and operate under control of the processor 470.

The coil part 150 may wirelessly provide electrical energy to the mobile terminal 20.

For example, the coil part 150 may provide electrical energy to the mobile terminal 20 based on resonance coupling.

For example, the coil part 150 may provide electrical energy to the mobile terminal 20 based on a resonance conducting.

The coil bracket 160 may be disposed below the coil part 150.

The coil bracket 160 may be disposed above the driving part 170.

The coil bracket 160 may fix the coil part 150. For example, the coil bracket 160 may secure the coil part 150 to the driving part 170 using a screw joint.

The driving part 170 may be disposed below the coil part 150.

The driving part 170 may drive the coil part 150.

Figure 10:
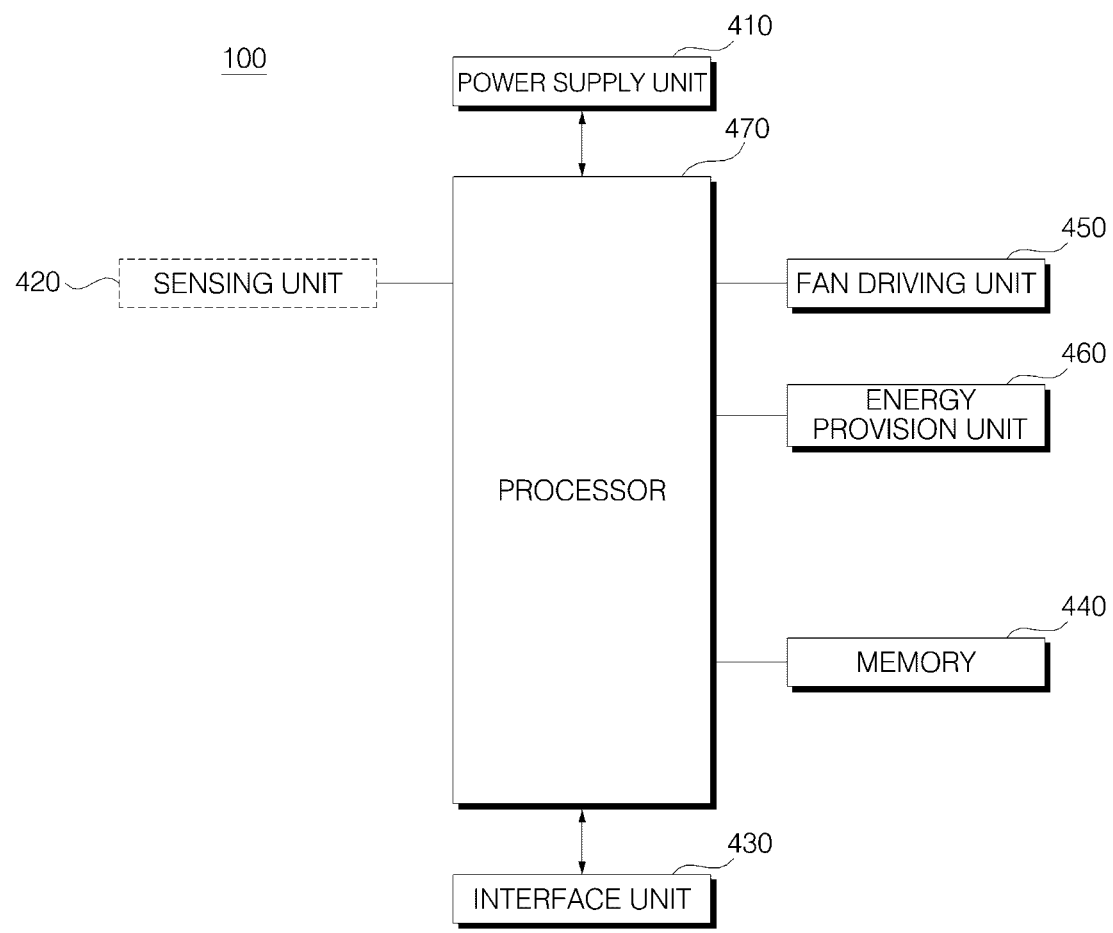
FIG. 10 is a control block diagram illustrating a wireless charger for a mobile terminal in a vehicle according to an embodiment of the present invention.

The driving part 170 may include a circuit board and the processor 470 (see FIG. 10).

The circuit board may include a Printed Circuit Board (PCB). A plurality of elements, such as an interface unit 430, a processor 470, a memory 440 (see FIG. 10), and a fan driving unit 450 (see FIG. 10), may be mounted on the circuit board.

The processor 470 may be mounted on the circuit board.

The processor 470 may control the coil part 150. The processor 470 may provide an electrical signal to the coil part 150 to drive the coil part 150, so that the coil part 150 wirelessly provides electrical energy to the mobile terminal 20.

The processor 470 may include at least one selected from among Application Specific Integrated Circuits (ASICs), Digital Signal Processors (DSPs), Digital Signal Processing Devices (DSPDs), Programmable Logic Devices (PLDs), Field Programmable Gate Arrays (FPGAs), processors, controllers, micro-controllers, microprocessors, and electric units for the implementation of other functions.

The heat sink 180 may be disposed below the driving part 170.

The heat sink 180 may be formed of a metal material. For example, the heat sink 180 may be formed of aluminum.

The heat sink 180 may discharge internal heat of the wireless charger 100 to the outside. For example, the heat sink 180 may discharge heat generated in the coil part 150 or the driver 170 to the outside of the wireless charger 100.

The fan module 190 may be disposed below the driver 170.

In some embodiments, the fan module 190 may be disposed above the tray 110.

The fan module 190 may induce air to circulate in an air flow path 230.

The fan module 190 may discharge air toward the mobile terminal 20 through holes included in the tray 110, or may suction ambient air of the mobile terminal 20. As the ambient air of the mobile terminal 20 flows, heat generated by wireless charging may be removed.

The fan module 190 may include one or more fans. The fan module 190 may discharge or suction air by rotating the fans.

The fan module 190 may include a plurality of fans.

For example, the fan module 190 may include a first fan and a second fan. In this case, the first fan discharges or suctions air through a first air flow path, and the second fan discharges or suctions air through a second air flow path. The first air flow path may be connected to a hole included in the tray 110. The second air flow path may be disposed between the coil part 150 and the driving part 170, between the coupling antenna 140 and the coil unit 150, or between the coupling antenna 140 and the plate 130.

The fan module 190 may include at least one selected from among a rotating fan, a solid state fan, a piezoelectric fan, a blower fan, an axial flow fan, and a mixed flow fan.

Meanwhile, in order to reduce vibration and noise caused by driving of a fan, a vibration absorber may be used in an area where a fan of the fan module 190 contacts a different component.

The case 200 may define the exterior appearance of the wireless charger 100. The case 200 may form an inner space where each component of the wireless charger 100 is accommodated and protected.

The case 200 may accommodate the coil part 150 and the driving part 170.

The case 200 may include an air flow path 230.

The air flow path 230 may be formed in the case 200.

The air flow path 230 may be connected to a space accommodating the fan module 190. One side of the air flow path 230 is connected to the space accommodating the fan module 190. The space accommodating the fan module 190 may be referred to as a fan module accommodator.

The air flow path 230 may be connected to the outside of the wireless charger 100 through holes included in the tray 110. The other side of the air flow path 230 is connected to the outside of the wireless charger 100 through the holes. The outside connected through the holes may be a space where the mobile terminal 20 is placed. The space where the mobile terminal 20 is placed may be referred to as a seat for the mobile terminal 20.

The air flow path 230 may include a first air passage 231, a second air passage 232, and a third air passage 233.

The first air passage 231 may be formed in a first direction. The first direction may be a vertical direction (for example, an overall height direction).

One end of the first air passage 231 may be connected to a fan module accommodator which accommodates the fan module 190.

The second air passage 232 may be formed in a second direction. The second direction may be a horizontal direction (for example, an overall length direction or an overall width direction).

The second air passage 232 may extend from the other end of the first air passage 231. One end of the second air passage 232 may be connected to the other end of the first air passage 231.

The third air passage 233 may be formed in a third direction. The third direction may be a direction at a predetermined angle (for example, 0 to 50 degrees) relative to the first direction. The third direction may be a direction at a predetermined angle (for example, 40 to 90 degrees) relative to the second direction.

The third air passage 233 may extend from the other end of the second air passage 232. One end of the third air passage 233 may be connected to one end of the second air passage 232.

The other end of the third air passage 233 may be connected through holes included in the tray 110 to a space where the mobile terminal 20 is placed.

The wireless charger 100 may further include a foreign substance blocking part 240. The foreign substance blocking part 240 may be formed in the air flow path 230.

The foreign substance blocking part 240 may block a foreign substance coming from the outside into the air flow path 230 through holes included in the tray 110. For example, if liquid comes in through the holes, the foreign substance blocking part 240 may prevent the liquid from reaching the fan module 190.

The foreign substance blocking part 240 may be formed in a portion in which the first air passage 231 and the second air flow 232 are connected. The foreign substance blocking part 240 may be a partition wall formed in the first direction (for example, an overall height direction).

A foreign substance flowing into the second air passage 232 is blocked by the foreign substance blocking part 240 and thus fails to reach the first air passage 231. As a result, malfunction of the fan module 190 may be prevented.

Meanwhile, the tray 110 may be detachable. It is possible to remove foreign substances blocked by the foreign substance blocking part 240 after detaching the tray 110.

Meanwhile, the air flow path 230 may be formed such that the more distal from the fan module 190, the narrower the cross section will be. Accordingly, air may be discharged at a higher speed upon operation of fans, thereby increasing heat removal performance.

For example, the first air passage 231 may be formed such that a cross section gradually becomes narrower in a direction from one end to the other end.

For example, the second air passage 232 may be formed such that a cross section gradually becomes narrower in a direction from one end to the other end.

For example, the third air passage 233 may be formed such that a cross section gradually becomes narrower in a direction from one end to the other end.

Figure 7:
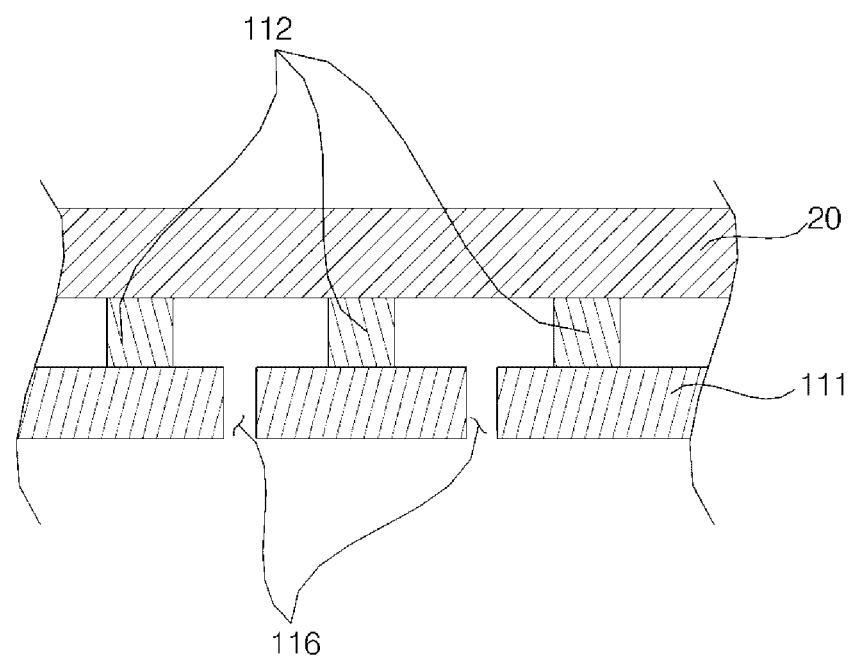
FIGS. 7 to 8B are diagrams illustrating a tray according to an embodiment of the present invention.
Figure 8A:
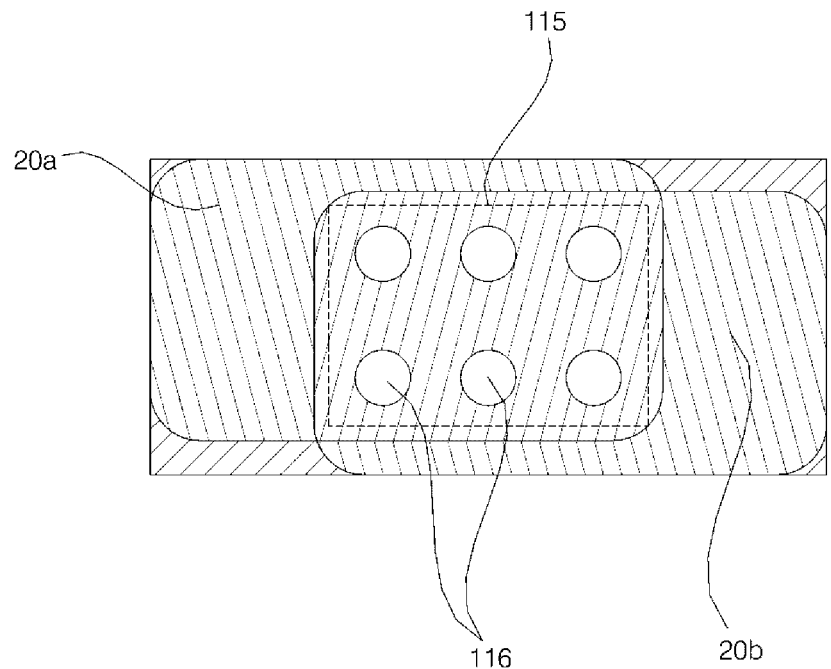
Figure 8B:
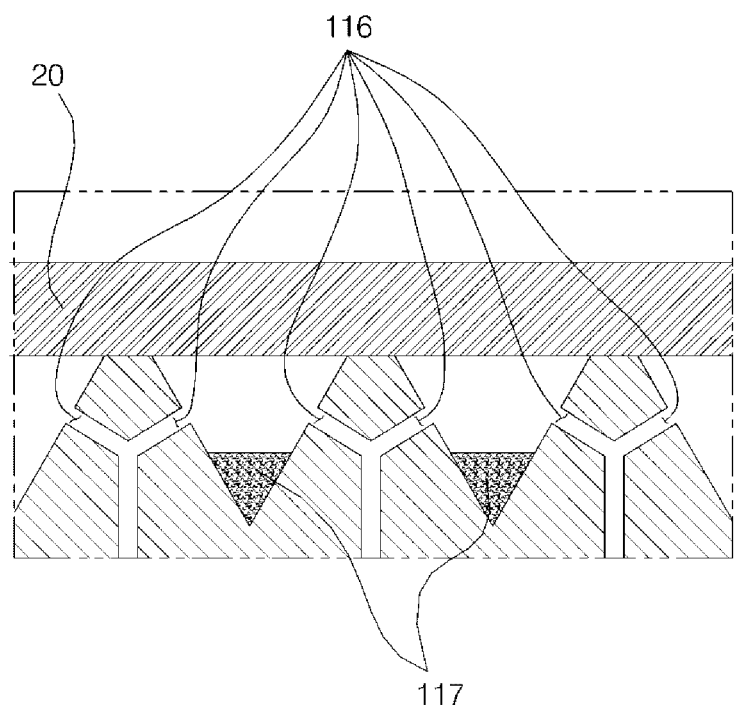

FIGS. 7 to 8B are diagrams of a tray according to an embodiment of the present invention.

FIG. 7 is an enlarged view of the portion S shown in FIG. 6.

Referring to FIG. 7, the tray 110 may be formed of a material selected for structural rigidity of the air flow path 230.

The tray 110 may include a base 111 and a contact part 112.

The base 111 may takes the form of a plate.

The base 111 may include a plurality of holes 116 formed therein. Each of the holes 116 may have a predetermined size. For example, each of the holes 116 may have a size of 1 mm$^2$ in consideration of airflow resistance and the need of blocking foreign substances and.

The contact part 112 may be formed on the base 111. The contact part 112 may protrude upward from the base 111. The contact part 112 may contact with the mobile terminal 20.

The contact part 112 may include a friction member on a contact surface, which will contact with the mobile terminal 20, so that the mobile terminal 20 is stably fixed without slipping. The friction member may be formed of a rubber material.

The contact part 112 may include a plurality of protrusions.

FIG. 8A is an example of a tray as seen from above.

Referring to FIG. 8A, the base 111 may have a first size in a horizontal direction.

The plurality of holes 116 formed in the base 111 may be formed in a first region 115 of the base 111.

The first region 115 may be located at the center of the base 111.

The first region 115 may have a second size smaller than the size of the mobile terminal 20.

In this case, no matter where the mobile terminal 20 may be positioned in any region 20a or 20b on the tray 110, the mobile terminal 20 covers the first region 115. Accordingly, air coming through the plurality of holes 116 formed in the first region 115 is provided to the mobile terminal 20 without leaking.

FIG. 8B is a diagram illustrating locations of holes.

Referring to FIG. 8B, the base 111 may takes the form of a plate.

The contact part 112 may protrude from the base 111 and contact with the mobile terminal 20.

The plurality of holes 116 may be formed on lateral surfaces of the contact part 112.

As the plurality of the holes 116 is formed on the lateral surfaces of the contact part 112, the probability of entrance of a foreign substance may be reduced as compared to the case where the plurality holes 116 is formed in the base 111. In particular, if the foreign substance is liquid 117, the liquid 117 does not come into the air flow path 230 unless it reaches the holes 116.

FIGS. 9A to 9K are diagrams illustrating various embodiments of a wireless charger for a mobile terminal in a vehicle.

Figure 9A:
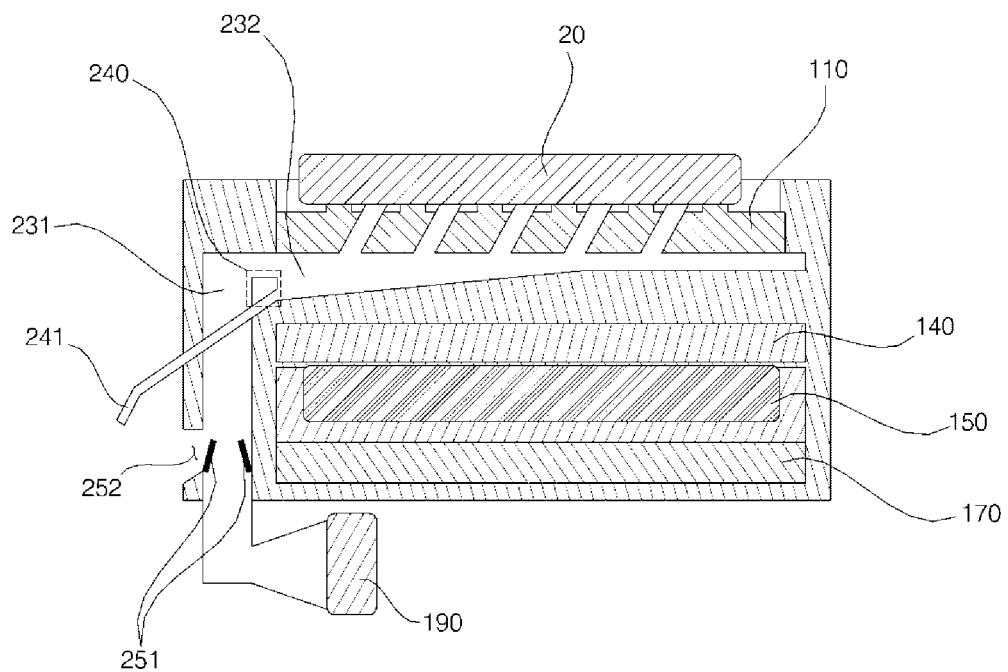
FIGS. 9A to 9K are diagrams illustrating various examples of a wireless charger for a mobile terminal in a vehicle according to an embodiment of the present invention.

Referring to FIG. 9A, the mobile charger 100 may further include a partition wall 251 and a foreign substance discharge hole 252.

The partition wall 251 may be disposed in the air flow path 230. For example, the partition wall 251 may be disposed inside the first air passage 231, which is formed in a vertical direction, such that the partition wall 251 is disposed at a predetermined angle relative to the first air passage 231. The partition wall 251 may be disposed on an inner sidewall of the first air passage 231. As a result, a liquid-type foreign substance flowing along the inner wall of the first air passage 231 may be blocked by the partition wall 251.

A foreign substance discharge hole 252 may be formed inside the air flow path 230. For example, the foreign substance discharge hole 252 may be formed inside the first air passage 231 which is formed in the vertical direction. The foreign substance discharge hole 252 may be formed in a portion higher than an area where the partition wall 251 contacts the first air passage 231. The foreign substance discharge hole 252 may communicate with the first air passage 231 and the outside of the wireless charger 100.

The foreign substance discharge hole 252 may discharge a foreign substance, blocked by the partition wall 251, to the outside of the wireless charger 100.

Meanwhile, the wireless charger 100 may further include a foreign substance discharge passage 241.

The foreign substance discharge passage 241 may communicate with the lower portion of the foreign substance blocking part 240 and the outside of the wireless charger 100.

As the air flow path 230 and the foreign substance discharge passage 241 are separated, it is possible to remove a foreign substance efficiently and allow the air to smoothly flow in the air flow path 230.

Meanwhile, the fan module 190 may be disposed on a lateral side of the lower portion of the first air passage 231 to drive a fan.

The fan module accommodator may be disposed on a lateral side of the lower portion of the first air passage 231. In this case, it is possible to directly prevent a foreign substance from flowing into the fan module 190.

Figure 9B:
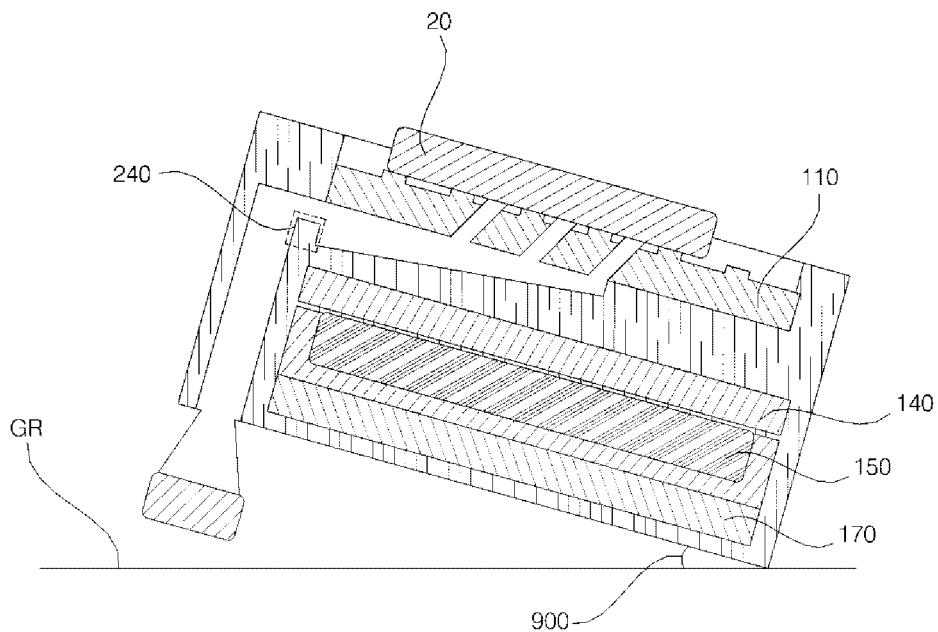

Referring to FIG. 9B, the wireless charger 100 may be inclined toward the ground surface GR.

In this case, the tray 110 may be disposed at a predetermined angle 900 relative to the ground surface GR.

Not just the tray 110 but the driving part 170, the coil part 150, and the coupling antenna 140 may be disposed at the predetermined angle 900 relative to the ground surface GR.

Due to the aforementioned structure, a foreign substance may be efficiently blocked by the foreign substance blocking part 240 even when the foreign substance flows in through holes included in the tray 110.

If a foreign substance discharge hole described with reference FIG. 9A is further included, it is possible to discharge a foreign substance more efficiently.

Figure 9C:
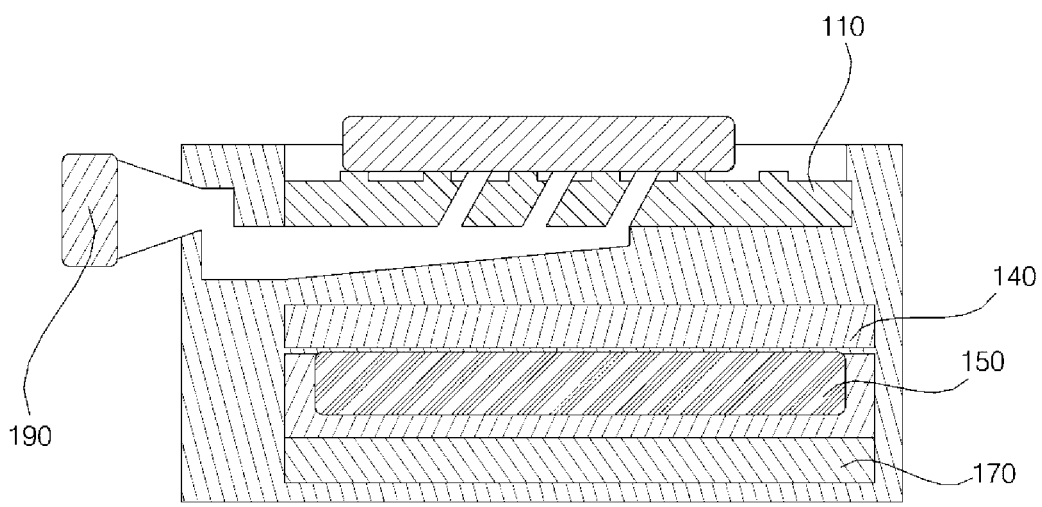

Referring to FIG. 9C, the fan module 190 may be disposed above the tray 110. That is, the fan module 190 may be disposed higher than the tray 110.

As the fan module 190 is disposed higher than the tray 110, a foreign substance cannot reach the fan module but accumulates in the bottom of the air flow path 230.

The tray 110 may be formed detachably. It is possible to easily remove foreign substances accumulated in the air flow path 230 after detaching the tray 110.

Figure 9D:
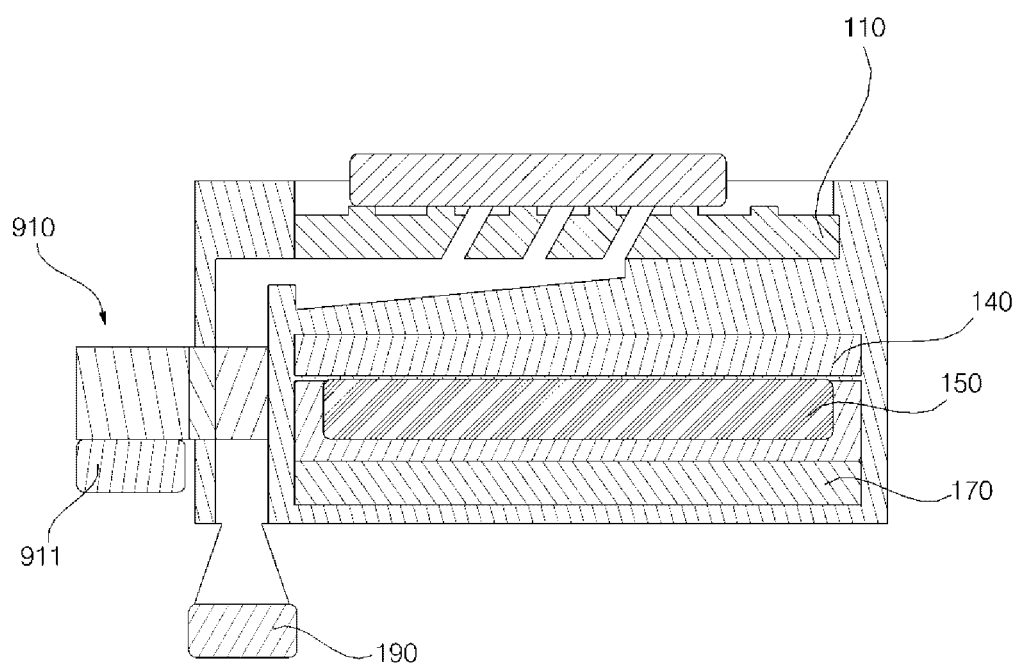

Referring to FIG. 9D, the wireless charger 100 may further include a cool air supplier 910.

The cool air supplier 910 may generate cool air. The generated cool air may be supplied to the inside of the air flow path 230 by the fan module or an additional fan 911.

The cool air supplier 910 may use a thermoelectric element or a magnetic cooler to generate cool air.

Figure 9E:
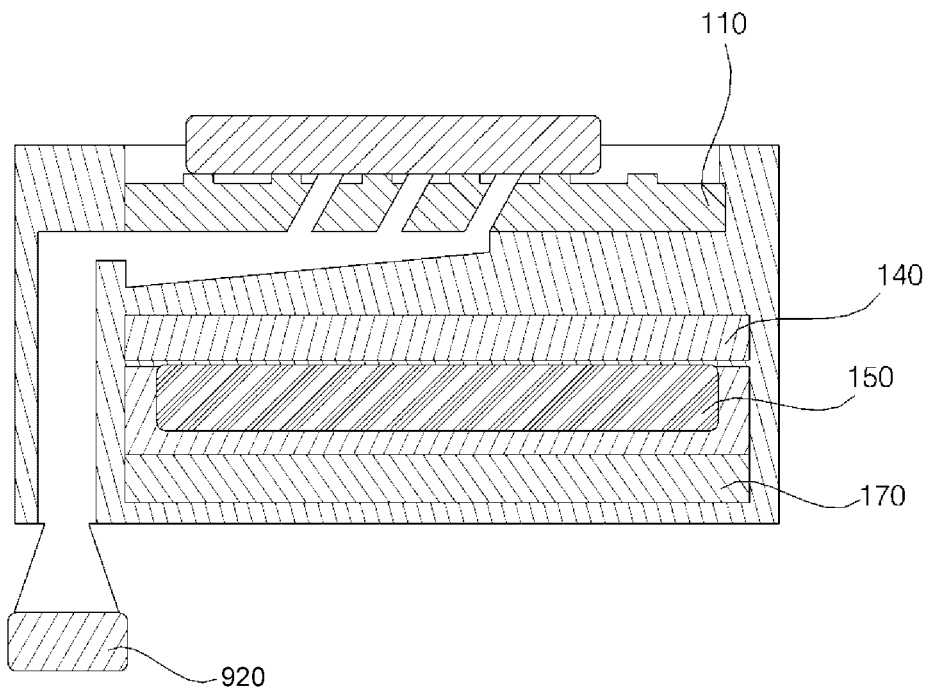

Referring to FIG. 9E, the wireless charger 100 may use an air conditioning system 920 of the vehicle 10, instead of the fan module 190.

The air flow path 230 may be connected to the air conditioning system 920 of the vehicle 10. The air conditioning system 920 may cause air circulation in the air flow path 230.

Figure 9F:
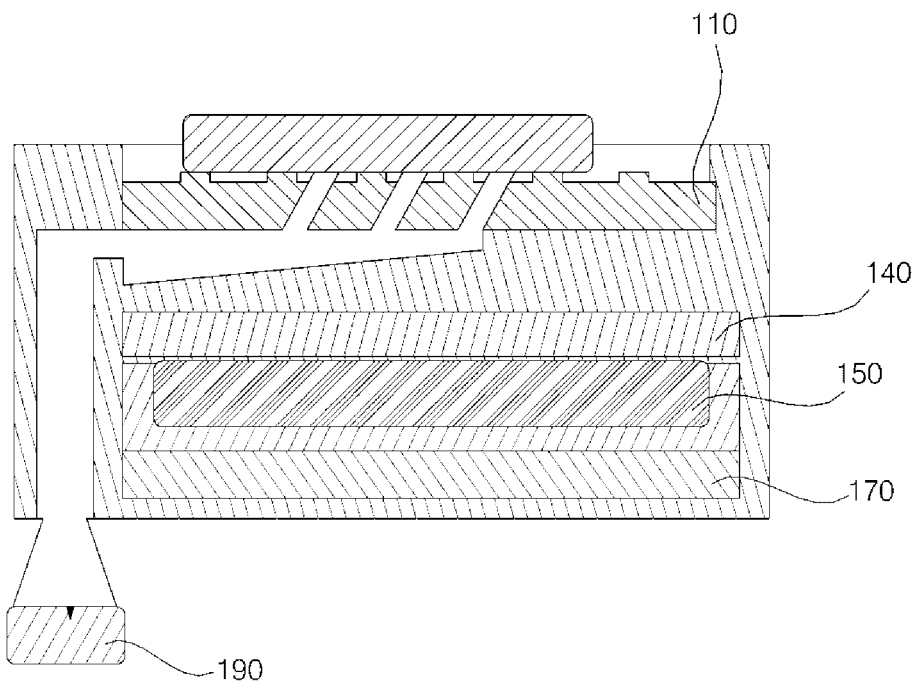

Referring to FIG. 9F, the fan module 190 may discharge air toward the mobile terminal 20 or suction ambient air of the mobile terminal 20 depending on a direction of rotation of a fan included in the fan module 190.

In some embodiments, the fan module 190 may include a first fan and a second fan.

If the fan module 190 drives the first fan under control of the processor 270, the fan module 190 may discharge air toward the mobile terminal 20.

If the fan module 190 drives the second fan under control of the processor 470, the fan module 190 may suction ambient air of the mobile terminal 20.

Figure 9G:
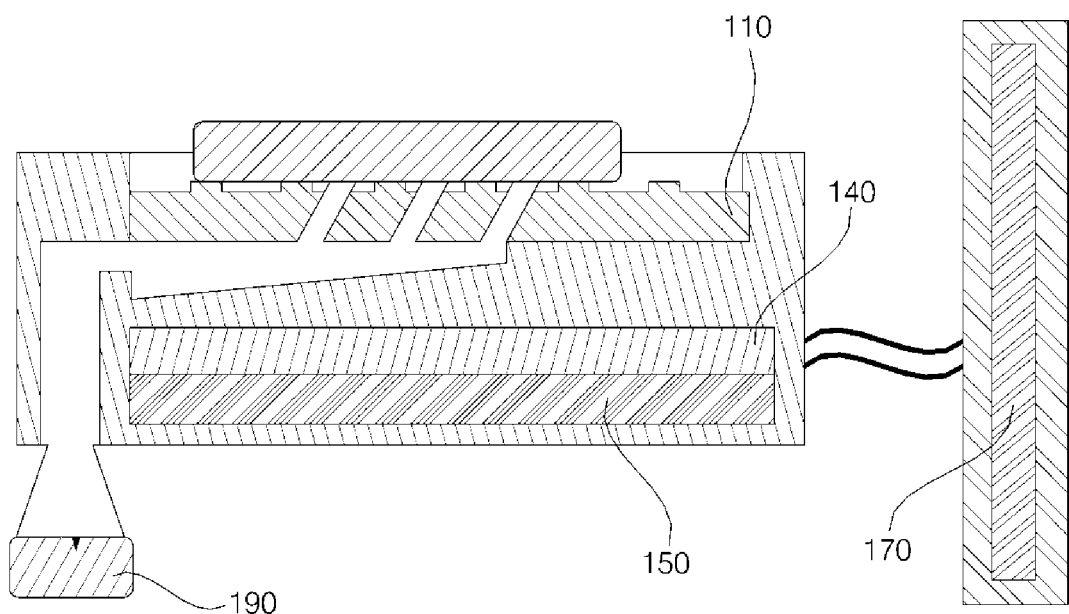

Referring to FIG. 9G, the driving part 170 may be spatially separated from the transmitting coil 150.

The driving part 170 may be disposed in a vertical direction. The pose of the coil part 150 is important when it comes to coupling for wireless charging, but it does not affect the wireless charging itself.

To reduce the volume of the whole wireless charger 100, the driving part 170 may be disposed not in a horizontal direction, but in a direction which is at a predetermined angle relative to the vertical direction or the ground surface.

In this case, freedom of design of the wireless charger 100 may improve.

Figure 9H:
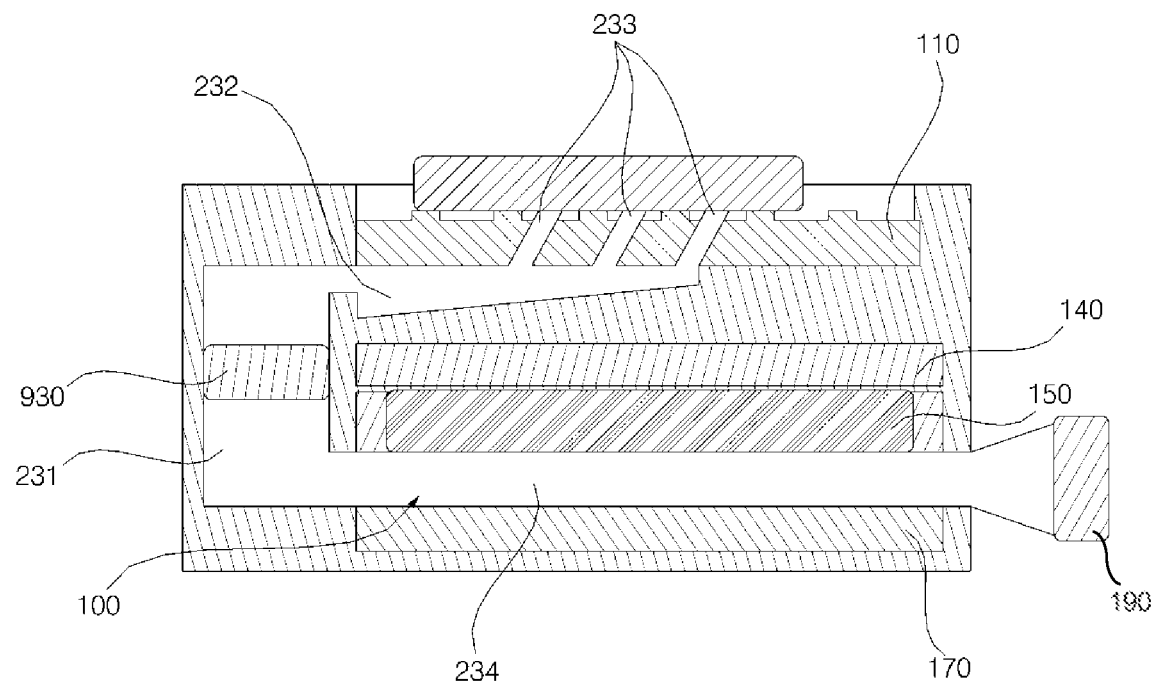

Referring to FIG. 9H, the air flow path 230 may include a first air passage 231, a second air passage 232, a third air passage 233, and a fourth air passage 234.

The first air passage 231 may be formed in a first direction. The first direction may be a vertical direction (for example, an overall height direction).

One end of the first air passage 231 may be connected to the fourth air passage 234. One end of the first air passage 231 may be connected to the other end of the fourth air passage 234. The first air passage 231 may extend from the other end of the fourth air passage 234.

The second air passage 232 may be formed in a second direction. The second direction may be a horizontal direction (for example, an overall length direction or an overall width direction).

The second air passage 232 may extend from the other end of the first air passage 231. One end of the second air flow passage 232 may be connected to the other end of the first air passage 231.

The third air passage 233 may be formed in a third direction. The third direction may be a direction which is at a predetermined angle (for example, 0 to 50 degrees) relative to the first direction. The third direction may be a direction which is at a predetermined angle (for example, 40 to 90 degrees) relative to the second direction.

The third air passage 233 may extend from the other end of the second air passage 232. One end of the third air passage 233 is connected to one end of the second air passage 232.

The other end of the third air passage 233 may be connected to a space where the mobile terminal 20 is placed, through the holes included in the tray 110.

The fourth air passage 234 may be formed in the second direction. The second direction may be a horizontal direction (for example, an overall length direction or an overall width direction).

The fourth air passage 234 may be disposed between the transmitting coil 150 and the driving part 170.

During wireless charging, heat is generated in the transmitting coil 150 and the driving part 170. The fourth air passage 234 may cool down the transmitting coil 150 and the driving part 170.

One end of the fourth air passage 234 may be connected to a fan module accommodator which accommodates the fan module 190.

The other end of the fourth air passage 234 may be connected to the first air passage 231.

An additional fan 930 may be further provided inside the air flow path 230. The additional fan 930 may increase air circulation force in the air flow path 230.

Figure 9I:
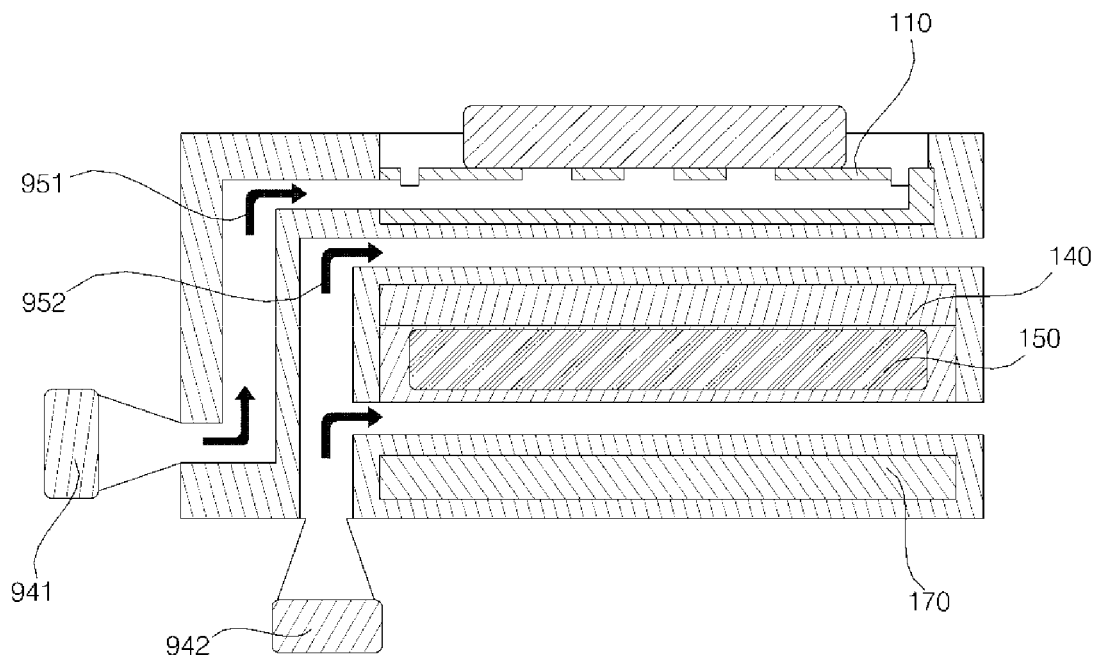

Referring to FIG. 9I, the fan module 910 may include a first fan 941 and a second fan 942.

The air flow path 230 may include a first air flow path 951 and a second air flow path 952.

The first fan 941 may be connected to the first air flow path 951.

The first air flow path 951 may be connected to a first fan accommodator which accommodates the first fan 941. The first air flow path 951 may discharge air toward the mobile terminal 20 through holes included in the tray 110.

The second air flow path 952 may be connected to a second fan accommodator which accommodates the second fan 942. The second air flow path 952 may discharge air toward the coil part 150 and the driving part 170.

The second air flow path 952 may be disposed between the coil part 150 and the driving part 170. The second air flow path 952 may be disposed between the coupling antenna 140 and the coil part 150. The second air flow path 952 may be disposed between the tray 110 and the coupling antenna 140.

The first air flow path 951 may communicate with a second fan accommodator, which accommodates the second fan 942, and the outside of the wireless charger 100.

The processor 470 may receive information on temperature of the mobile terminal 20 from the mobile terminal 20.

The sensing unit 420 may be disposed in the surroundings of the coil part 150 or the driving part 170 to generate the information on temperature of the mobile terminal 20.

The processor 470 may receive the information on temperature of the mobile terminal 20 from the sensing unit 420.

The processor 470 may drive the first fan 941 based on the information on temperature of the mobile terminal 20.

The processor 470 may drive the second fan 942 based on information on temperature of the surroundings of the coil part 150 or the driving part 170.

The processor 470 may drive the first fan 941 and the second fan 942 individually based on received temperature information.

Figure 9J:
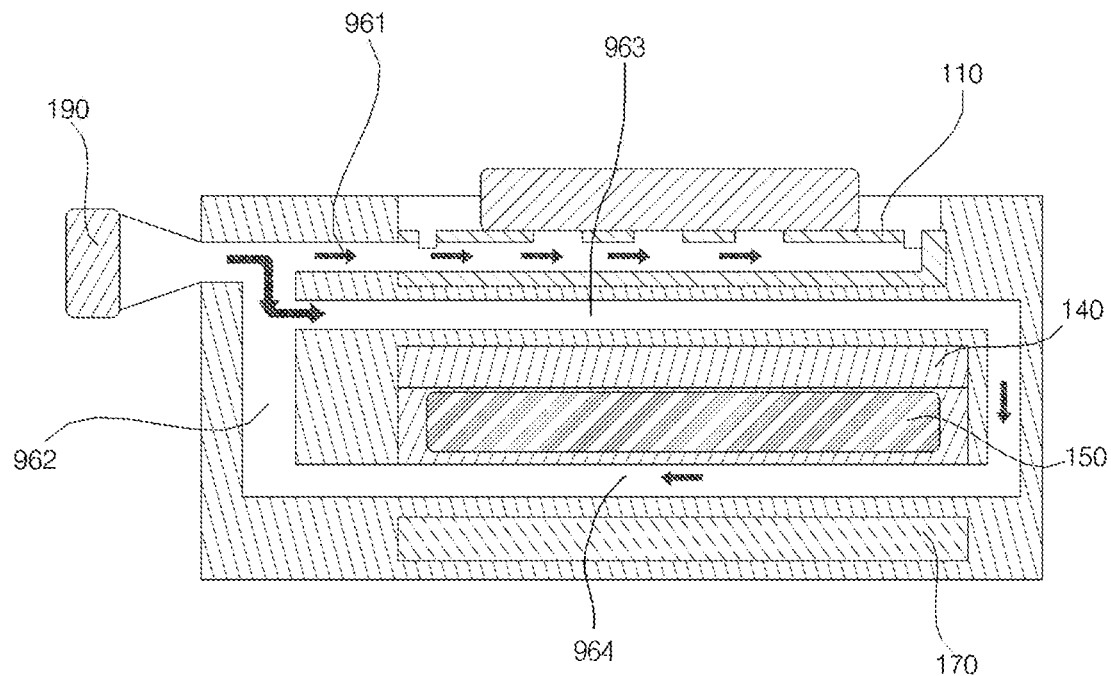

Referring to FIG. 9J, the air flow path 230 may include a first air flow path 961 and a second air flow path 962.

The first air flow path 961 may be disposed below the tray 110. The first air flow path 961 may be connected to the holes included in the tray 110.

The first air flow path 961 may allow the air, which is to be discharged toward the mobile terminal 20 through holes, to flow.

The first air flow path 961 may allow the ambient air of the mobile terminal 20, which is suctioned through holes, to flow.

The second air flow path 962 may include an air circulation passage. The second air flow path 962 may include a first air passage 963 and a second air passage 964.

The first air passage 963 may be disposed between the tray 110 and the coil part 150.

The second air passage 964 may be disposed between the coil part 150 and the driving part 170.

The fan module 190 may induce the air to flow through the first air passage 963 and the second air passage 964.

The fan module 190 may induce the air to circulate along the first air flow path 961.

In this configuration, it is possible to remove heat generated in the mobile terminal 20 and heat generated in the coil part 150 and the driving part 170.

Figure 9K:
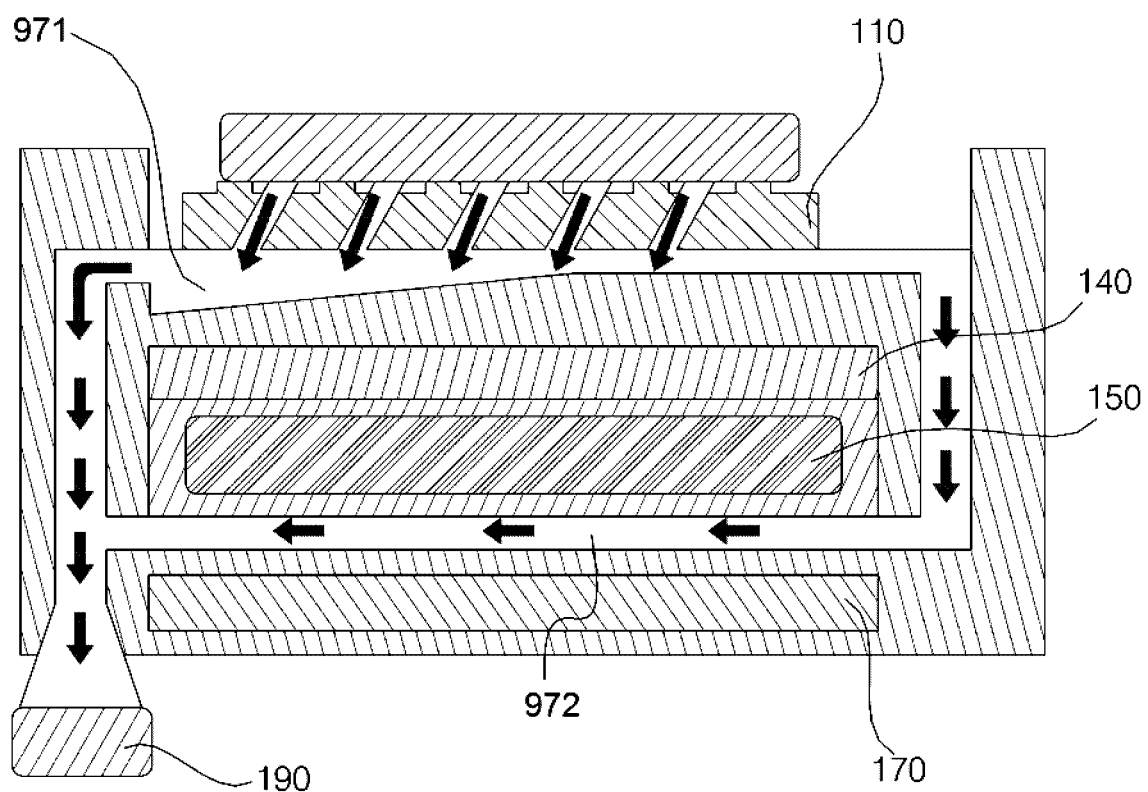

Referring to FIG. 9K, the air flow path 230 may include an air circulation passage. The air flow path 230 may include a first air passage 971 and a second air passage 972.

The first air passage 971 may be disposed between the tray 110 and the coil part 150.

The second air passage 972 may be disposed between the coil part 150 and the driving part 170.

The fan module 190 may induce ambient air of the mobile terminal 20 to be suctioned into the air flow path 230 through holes.

The suctioned air is distributed to the first air passage 971 and the second air passage 972 and move toward the fan module 190.

In this configuration, it is possible to remove heat generated in the mobile terminal 20 and heat generated in the coil part 150 and the driving part 170.

FIG. 10 is a control block diagram of a wireless charger for a mobile terminal in a vehicle according to an embodiment of the present invention.

The driving part 170 may include a circuit board, an element mounted on the circuit board, a circuit, and a module.

Specifically, the driving part 170 may include a circuit board, an interface unit 430, a memory 440, a fan driving unit 450, an energy provision unit 460, and a processor 470.

Referring to FIG. 10, the wireless charger 100 may include a power supply unit 410, the interface unit 430, the memory 440, the fan driving unit 450, the energy provision unit 460, and the processor 470.

In some embodiments, the wireless charger 100 may further include a sensing unit 420.

The power supply unit 410 may supply power required for operation of each element of the wireless charger 100. The power supply unit 410 may be supplied with power from a battery inside the vehicle 10.

The power supply unit 410 may wirelessly supply electrical energy to the mobile terminal 20.

For example, the power supply unit 410 may supply direct current (DC) power to the energy provision unit 460.

The sensing unit 420 may include at least one temperature sensor.

The temperature sensor may be disposed in the surroundings of at least one selected from among the coupling antenna 140, the coil part 150, and the driving part 170.

The temperature sensor may sense temperature by heat generated by at least one of the coupling antenna 140, the coil part 150, and the driving part 170.

The interface unit 430 may exchange information, data, or a signal with a different device included in the vehicle 10. The interface unit 430 may transmit received information, data, or a signal to the processor 470. The interface unit 430 may transmit information, data, or a signal, which is generated or processed by the processor 470, to a difference device included in the vehicle 10.

The interface unit 430 may be mounted on the circuit board.

The interface unit 430 may receive driving situation information.

The driving situation information may include at least one selected from among information on an object outside the vehicle 10, navigation information, and vehicle state information.

The information on an object may include information on the presence of the object, information on a location of the object, information on a distance between the vehicle 10 and the object, and information on a speed of the vehicle 10 relative to the object.

The navigation information may include at least one selected from among map information, information on a set destination, information on a route to the set destination, information on various objects along the route, lane information, and information on a current location of the vehicle.

The vehicle state information may be information that is generated based on data sensed by various sensors provided in the vehicle 10.

For example, the vehicle state information may include vehicle attitude information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, vehicle engine temperature information, etc.

The interface unit 430 may receive vehicle speed information.

The memory 440 is electrically connected to the processor 470. The memory 440 may store basic data for each unit, control data for the operational control of each unit, and input/output data. The memory 440 may be any of various hardware storage devices, such as a ROM, a RAM, an EPROM, a flash drive, and a hard drive. The memory 440 may store various data for the overall operation of the wireless charger 100, such as programs for the processing or control of the processor 470.

In some embodiments, the memory 440 may be integrally formed with the processor 470, or may be provided as an element of the processor 470.

The memory 440 may be mounted on the circuit board.

The fan driving unit 450 may drive a fan included in the fan module 190. The fan driving unit 450 may operate under control of the processor 470.

The fan driving unit 450 may include a motor and a motor control circuit.

The energy provision unit 460 may operate under control of the processor 470.

The energy provision unit 460 may include a converter, an inverter, and the coil part 150.

The energy provision unit 460 may convert electrical energy, provided by the power supply unit 410, to conform to a wireless charging method. To this end, the energy provision unit 460 may include the converter and the inverter.

The converter may include a DC-DC converter. The DC-DC converter may step up or step down DC power provided by a power supply unit.

The inverter may include a DC-AC inverter. For example, the inverter may include a full bridge circuit. The DC-AC inverter may convert DC power, stepped up or down by the DC-DC converter, into AC power.

The coil part 150 (see FIG. 5) may transfer electrical energy to the mobile terminal 20 based on the AC power converted by the inverter.

The mobile terminal 20 may charge a battery with transferred electrical energy. The mobile terminal 20 may charge the battery by converting AC power into DC power.

The converter and inverter of the energy provision unit 460 may be mounted on the circuit board.

The processor 470 may control overall operation of each unit of the wireless charger 100.

The processor 470 may receive driving situation information.

The processor 470 may control driving of a fan module based on driving situation information.

For example, the processor 470 may control a rotational speed of a fan included in the fan module based on vehicle speed information of the vehicle 10. The processor 470 may control the rotational speed of the fan based on control of the fan driving unit 450.

For example, the processor 470 may control the rotational speed of the fan in proportion to a speed of the vehicle 10. If the speed of the vehicle 10 is reduced, the processor 470 may control the rotational speed of the fan to be reduced gradually. If the speed of the vehicle 10 is increased, the processor 470 may control the rotational speed of the fan to increase gradually.

When the vehicle 10 travels at a low speed, noise is not generated by the travelling of the vehicle 10 does not occur so a user may hear loud noise caused by the driving of the fan module 190. In this case, the processor 470 may reduce the rotational speed of the fan so that the user may not perceive noise caused by the driving of the fan module 190.

When the vehicle 10 travels at a high speed, a user may not aware of noise cause by the driving of the fan module 190 because loud noise is generated by the travelling of the vehicle 10. In this case, if the rotational speed of the fan is increased, it is possible to quickly and efficiently remove heat generated by wireless charging.

The processor 470 may receive information on temperature of the mobile terminal 20.

For example, the processor 470 may receive information on temperature of the mobile terminal 20 from the mobile terminal 20 through an NFC antenna.

For example, the processor 470 may receive information on temperature of the mobile terminal 20 from the mobile terminal 20 through the coil part 150.

The coil part 150 may transfer electrical energy to the mobile terminal 20 using AC power. The AC power may have a predetermined frequency. The coil part 150 may exchange information with the mobile terminal 20 at the frequency of the AC power.

The coil part 150 may receive temperature information of the mobile terminal 20 at the frequency of the AC power.

After wireless charging of the mobile terminal 20 is complete, the processor 470 may control the fan module 190 to be driven for a preset period of time.

Even after wireless charging of the mobile terminal 20 is complete, heat generated by the wireless charging may constantly remain.

After wireless charging is complete, the processor 470 may control the fan module 190 to be driven for a preset period of time so as to remove residual heat.

The processor 470 may be mounted on the circuit board.

Thus, the above detailed description should not be construed as being limited to the embodiments set forth herein in all terms, but should be considered by way of example. The scope of the present invention should be determined by the reasonable interpretation of the accompanying claims and all changes in the equivalent range of the present invention are intended to be included in the scope of the present invention.

What is claimed is:

1. A wireless charger for a mobile terminal in a vehicle, the wireless charger comprising:
   a tray configured to receive the mobile terminal thereon, the tray having one or more holes therein;
   a coil part configured to wirelessly provide electrical energy to the mobile terminal;
   a driving part configured to drive the coil part;
   a case accommodating the coil part and the driving part therein, the case including an air flow path;
   a fan module configured to either discharge air toward the mobile terminal through the air flow path and the one or more holes, or suction ambient air past the mobile terminal and through the one or more holes and the air flow path; and
   a fan module accommodator in which the fan module is accommodated,
   wherein the air flow path comprises:
      a first air passage extending in a first direction, the first air passage having a first end connected to the fan module accommodator, and a second end opposite the first end;
      a second air passage extending in a second direction, the second air passage having a third end extending from the second end of the first air passage, and a fourth end opposite the third end; and
      a third air passage extending in a third direction, the third air passage having:

a fifth end extending from fourth end of the second air passage; and
a sixth end opposite the fifth end, the sixth end connected through the one or more holes to a space where the mobile terminal is received on the tray.

2. The wireless charger according to claim 1, further comprising a coupling antenna configured to:
receive a mobile communication signal through an antenna provided in the vehicle, and
transfer the mobile communication signal to the mobile terminal.

3. The wireless charger according to claim 1, wherein the tray comprises:
a base having the one or more holes located therein; and
a contact part protruding from the base to contact the mobile terminal.

4. The wireless charger according to claim 3, wherein the base has a first region located at a center of the base, the first region being smaller in size than a size of the mobile terminal, and
wherein the one or more holes are located in the first region.

5. The wireless charger according to claim 3, wherein the contact part comprises a friction member.

6. The wireless charger according to claim 1, wherein the tray comprises:
a plate-shaped base; and
a contact part protruding from the base to contact the mobile terminal, and
wherein the one or more holes are located on lateral surfaces of the contact part.

7. The wireless charger according to claim 1, further comprising a foreign substance blocking part provided at a location where the first air passage and the second air passage are connected.

8. The wireless charger according to claim 1, wherein the second air passage has a cross section that gradually becomes narrower in a direction extending from the third end of the second air passage to the fourth end of the second air passage.

9. The wireless charger according to claim 1, further comprising:
a partition wall provided in the first air passage, the partition wall being provided at a predetermined angle relative to the first direction of the first air passage; and
a foreign substance discharge hole provided in the case, the foreign substance discharge hole being connected to the first air passage and configured to discharge a foreign substance, blocked by the partition wall, to an outside of the wireless charger.

10. The wireless charger according to claim 1, wherein the tray is inclined at a predetermined angle relative to a horizontal surface.

11. The wireless charger according to claim 1, wherein the fan module is located above the tray.

12. A wireless charger for a mobile terminal in a vehicle, the wireless charger comprising:
a tray configured to receive the mobile terminal thereon, the tray having one or more holes therein;
a coil part configured to wirelessly provide electrical energy to the mobile terminal;
a driving part configured to drive the coil part;
a case accommodating the coil part and the driving part therein, the case including an air flow path; and
a fan module configured to either discharge air toward the mobile terminal through the air flow path and the one or more holes, or suction ambient air past the mobile terminal and through the one or more holes and the air flow path;
wherein the fan module comprises a first fan and a second fan, and further comprising:
a first fan accommodator in which the first fan is accommodated; and
a second fan accommodator in which the second fan is accommodated, and
wherein the air flow path comprises:
a first air flow path connected to the first fan accommodator and configured to discharge air toward the mobile terminal through the one or more holes; and
a second air flow path connected to the second fan accommodator and configured to discharge air toward the coil part and the driving part.

13. A wireless charger for a mobile terminal in a vehicle, the wireless charger comprising:
a tray configured to receive the mobile terminal thereon, the tray having one or more holes therein;
a coil part configured to wirelessly provide electrical energy to the mobile terminal;
a driving part configured to drive the coil part;
a case accommodating the coil part and the driving part therein, the case including an air flow path; and
a fan module configured to either discharge air toward the mobile terminal through the air flow path and the one or more holes, or suction ambient air past the mobile terminal and through the one or more holes and the air flow path;
wherein the air flow path comprises:
a first air passage located between the tray and the coil part; and
a second air passage located between the coil part and the driving part, and
wherein the fan module induces air to flow through the first air passage and the second air passage.

14. A wireless charger for a mobile terminal in a vehicle, the wireless charger comprising:
a tray configured to receive the mobile terminal thereon, the tray having one or more holes therein;
a fan module configured to either discharge air toward the mobile terminal through an air flow path and the one or more holes, or suction ambient air past the mobile terminal and through the one or more holes and the air flow path;
a coil part configured to wirelessly provide electrical energy to the mobile terminal;
a driving part comprising:
a circuit board;
an interface mounted on the circuit board and configured to receive driving situation information, the driving situation information being at least one of a group selected from information on an object outside the vehicle, navigation information, and vehicle state information;
a processor mounted on the circuit board and configured to receive driving situation information from the interface, drive the coil part, and drive the fan module based on the driving situation information received by the processor; and
a case accommodating the coil part and the driving part therein, the case including the air flow path.

15. The wireless charger according to claim 14, wherein the interface is further configured to receive vehicle speed information, and wherein the processor is further configured to control a rotational speed of the fan module based on the vehicle speed information.

16. The wireless charger according to claim 14, wherein the processor is further configured to receive temperature information from the mobile terminal, and wherein the processor is further configured to control a rotational speed of the fan module based on the temperature information.

17. The wireless charger according to claim 16, wherein the processor is further configured to receive the temperature information through the coil part.

18. The wireless charger according to claim 14, wherein the processor is further configured to control the fan module to be driven for a preset period of time after wireless charging of the mobile terminal is complete.

* * * * *